(12) United States Patent
Liao et al.

(10) Patent No.: US 9,276,176 B2
(45) Date of Patent: Mar. 1, 2016

(54) LIGHT-EMITTING DEVICE

(71) Applicant: EPISTAR CORPORATION, Hsinchu (TW)

(72) Inventors: Wen-Luh Liao, Hsinchu (TW); Hung-Ta Cheng, Hsinchu (TW); Yao-Ru Chang, Hsinchu (TW); Shih-I Chen, Hsinchu (TW); Chia-Liang Hsu, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 0 days.

(21) Appl. No.: 14/515,147

(22) Filed: Oct. 15, 2014

(65) Prior Publication Data
US 2015/0102285 A1    Apr. 16, 2015

(30) Foreign Application Priority Data
Oct. 15, 2013    (TW) .............................. 102137244 A

(51) Int. Cl.
| H01L 33/36 | (2010.01) |
| H01L 33/46 | (2010.01) |
| H01L 33/06 | (2010.01) |
| H01L 33/42 | (2010.01) |
| H01L 33/44 | (2010.01) |
| H01L 33/38 | (2010.01) |

(52) U.S. Cl.
CPC ................ *H01L 33/46* (2013.01); *H01L 33/06* (2013.01); *H01L 33/36* (2013.01); *H01L 33/38* (2013.01); *H01L 33/42* (2013.01); *H01L 33/44* (2013.01); *H01L 33/387* (2013.01)

(58) Field of Classification Search
CPC .............................. H01L 33/36; H01L 33/387
USPC .................................................... 257/E33.062
See application file for complete search history.

(56) References Cited

U.S. PATENT DOCUMENTS

| 4,864,370 A | * | 9/1989 | Gaw et al. ........................ 257/94 |
| 5,698,865 A | * | 12/1997 | Gerner et al. .................... 257/94 |
| 2010/0283081 A1 | * | 11/2010 | Huang et al. ..................... 257/99 |

* cited by examiner

*Primary Examiner* — Mark Prenty
(74) *Attorney, Agent, or Firm* — Patterson & Sheridan, LLP

(57) ABSTRACT

A light-emitting device comprises: a light-emitting stack having an active layer; a transparent insulating layer on the light-emitting stack; and an electrode structure having a first electrode on the transparent insulating layer; wherein a surface area of a surface of the first electrode distal from the transparent insulating layer is smaller than a surface area of a surface of the transparent insulating layer distal from the light-emitting stack, the refractive index of the transparent insulating layer is between 1 and 3.4 both inclusive, and the transmittance of the transparent insulating layer is greater than 80%.

20 Claims, 3 Drawing Sheets

LIGHT-EMITTING DEVICE

REFERENCE TO RELATED APPLICATION

This application claims the right of priority based on TW application Ser. No. 102137244, filed on Oct. 15, 2013, and the content of which is hereby incorporated by reference in its entirety.

TECHNICAL FIELD

The present application relates to a light-emitting device, and particularly to a light-emitting device comprising a transparent insulating layer.

DESCRIPTION OF BACKGROUND ART

The principle of light emission of a light-emitting diode (LED) is different from that of an incandescent light. Besides, the junction temperature of a light-emitting diode (LED) is much lower than the filament temperature of an incandescent light, and therefore an LED is a cold light source. Furthermore, the light-emitting diodes have advantages such as high durability, longer lifetime, lower power consumption, and small size. As a result, the lighting market has high expectation of the light-emitting diodes becoming a new generation of lighting sources to gradually replace the conventional light sources, while the light-emitting diodes are applied to various fields such as traffic lights, back light modules, street lighting, and medical equipment.

FIG. 1A shows a conventional light-emitting device. As shown in FIG. 1A, the conventional light-emitting device 100 comprises a transparent substrate 11, a semiconductor stack 12 on the transparent substrate 11, and an electrode 14 on the semiconductor stack 12, wherein the semiconductor stack 12 comprises a first conductive type semiconductor layer 120, an active layer 122 and a second conductive type semiconductor layer 124 in sequence in a direction from the electrode 14 to the transparent substrate 11.

Besides, the light-emitting device 100 mentioned above is able to further combine with other elements to form a light-emitting apparatus as shown in FIG. 1B. FIG. 1B shows a conventional light-emitting apparatus 200 comprising a submount 15 comprising a circuit 150, a solder 13 on the submount 15, by which the above light-emitting device 100 can be fixed on the submount 15, and by which the substrate 11 of the above light-emitting device 100 is electrically connected to the circuit 150 on the submount 15; and an electrical connection structure 16 for electrically connecting a pad 14 of the light-emitting device 100 to the circuit 150 on the submount 15; wherein the submount 15 can be a lead frame or a large mounting substrate for facilitating the design of the electrical circuit of the light-emitting apparatus 200 and increasing the heat dissipation efficiency.

SUMMARY OF THE DISCLOSURE

A light-emitting device comprises: a light-emitting stack having an active A light-emitting device comprises: a light-emitting stack having an active layer; a transparent insulating layer on the light-emitting stack; and an electrode structure having a first electrode on the transparent insulating layer; wherein a surface area of a surface of the first electrode distal from the transparent insulating layer is smaller than a surface area of a surface of the transparent insulating layer distal from the light-emitting stack, the refractive index of the transparent insulating layer is between 1 to 3.4 both inclusive, and the transmittance of the transparent insulating layer is greater than 80%.

DETAILED DESCRIPTION OF PREFERRED EMBODIMENTS

Figure 1A:
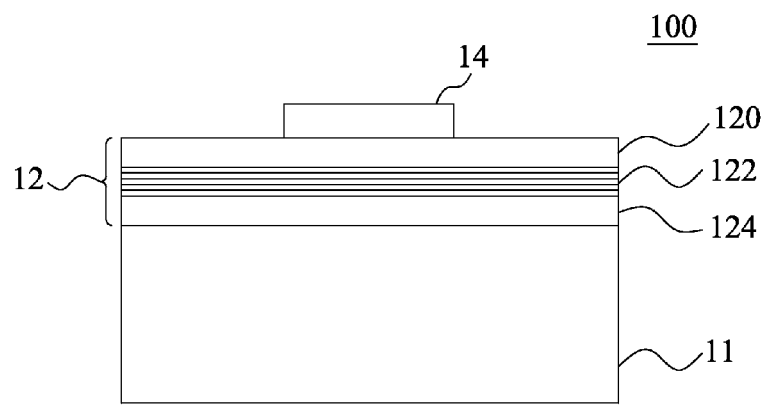
FIG. 1A shows a conventional light-emitting device.
Figure 1B:
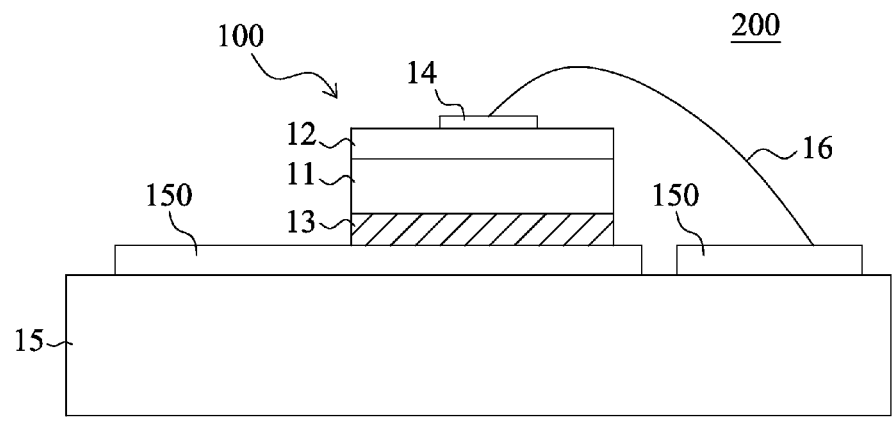
FIG. 1B shows a conventional light-emitting apparatus.

Exemplary embodiments of the present application will be described in detail with reference to the accompanying drawings hereafter. The following embodiments are given by way of illustration to help those skilled in the art fully understand the spirit of the present application. Hence, it should be noted that the present application is not limited to the embodiments herein and can be realized by various forms. Further, the drawings are not precise scale and components may be exaggerated in view of width, height, length, etc. Herein, the similar or identical reference numerals will denote the similar or identical components throughout the drawings.

Figure 2A:
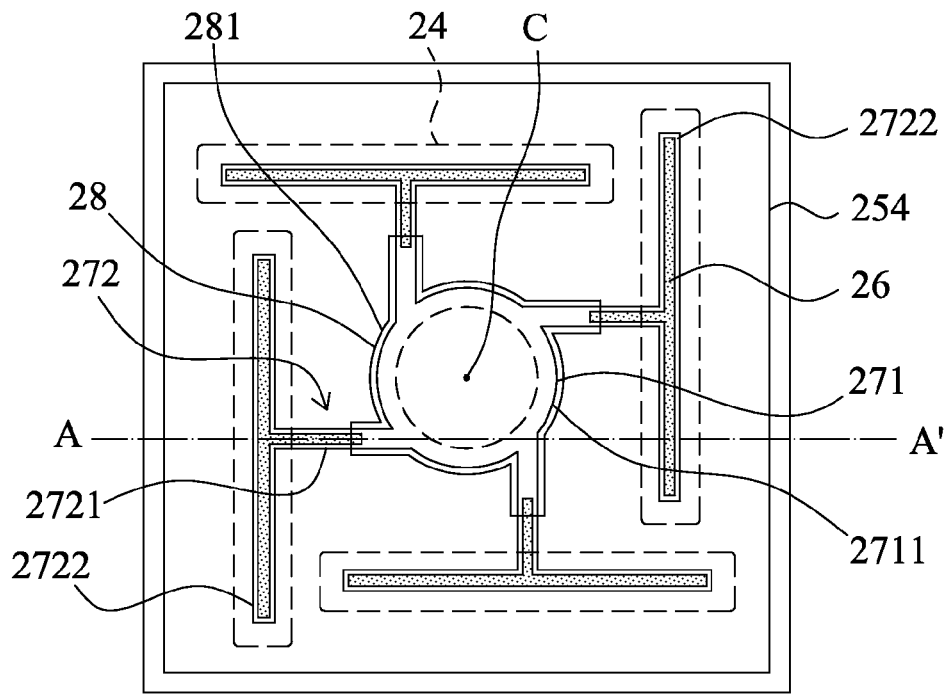
FIG. 2A shows a top view of a light-emitting device in accordance with the first embodiment of the present application.
Figure 2B:
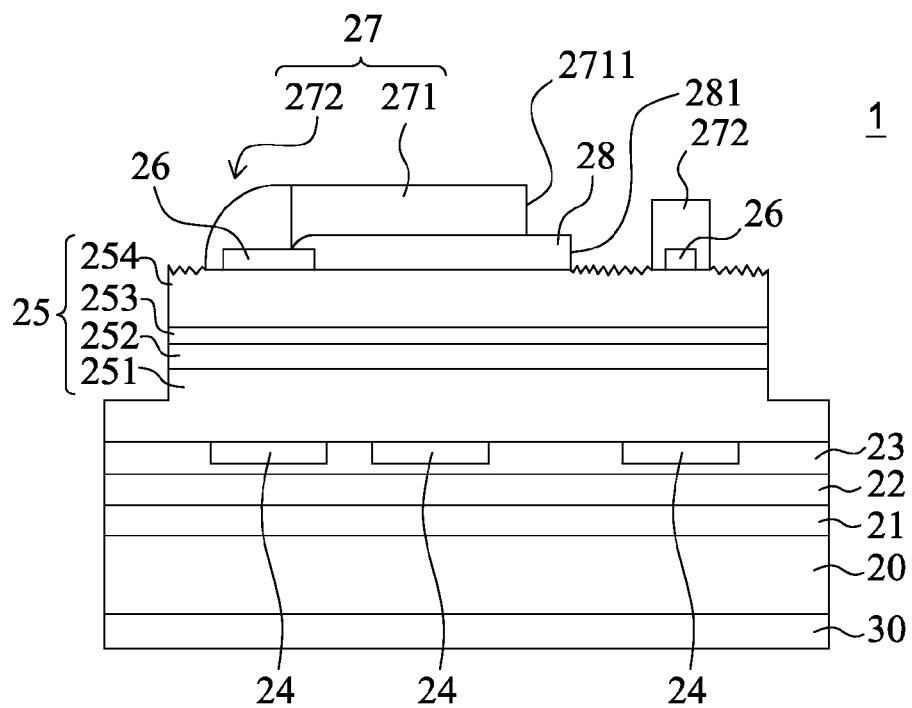
FIG. 2B shows a cross sectional view along the line of A-A' in accordance with the light-emitting device of the present application shown in FIG. 2A.

FIG. 2A is a top view of a light-emitting device 1 in accordance with the first embodiment of the present application. FIG. 2B shows a cross sectional view along the line of A-A' in accordance with the light-emitting device of the present application shown in FIG. 2A. Referring to FIG. 2B, a light-emitting device 1 comprises a substrate 20, a bonding layer 21 on the substrate 20, a reflective layer 22 on the bonding layer 21, a transparent conductive layer 23 on the reflective layer 22, a light-emitting stack 25 on the transparent conductive layer 23, an insulating layer 24 between the transparent conductive layer 23 and the light-emitting stack 25, an electrical contact layer 26 on the light-emitting stack 25, a transparent insulating layer 28 on the light-emitting stack 25 and in contact with the electrical contact layer 26, an electrode structure 27 partially on the transparent insulating layer 28 and the electrical contact layer 26, and a second electrode 30 below the substrate 20. The electrode structure 27 comprises a first electrode 271 on the transparent insulating layer 28 and comprises an extension electrode 272 on the electrical contact layer 26. The first electrode 271 comprises a surface distal from the transparent insulating layer 28. The transparent insulating layer 28 comprises a surface distal from the light-emitting stack 25. The surface area of the surface of the first electrode 271 is smaller than the surface area of the surface of the transparent insulating layer 28. The transparent insulating layer 28 has a refractive index between 1 and 3.4 both inclusive and has a transmittance greater than 80% at the wavelength of the light emitted from the light-emitting stack 25. The light-emitting stack 25 comprises a window layer 251 between the transparent conductive layer 23 and the electrode structure 27, a first conductive type semiconductor layer 252 between the window layer 251 and the electrode structure 27, an active layer 253 between the first conductive type semiconductor layer 252 and the electrode structure 27, and a second conductive type semiconductor layer 254 between the active layer 253 and the electrode structure 27. The second conductive type semiconductor layer 254 comprises a surface distal from the substrate 20, wherein an exposed part of the surface is a rough surface, that is, the part of the surface of the second conductive type semiconductor layer 254 that is not in contact with the electrical contact layer 26, the extension electrode 272 and the transparent insulating layer 28 is a rough surface.

The electrode structure 27 and/or the second electrode 30 are for receiving an external voltage. The material of the electrode structure 27 comprises transparent conductive material or metal material. The transparent conductive material comprises indium tin oxide (ITO), indium oxide (InO), tin oxide (SnO), cadmium tin oxide (CTO), antimony tin oxide (ATO), aluminum zinc oxide (AZO), zinc tin oxide (ZTO), gallium doped zinc oxide (GZO), tungsten doped indium oxide (IWO), zinc oxide (ZnO), AlGaAs, GaN, GaP, GaAs, GaAsP, indium zinc oxide (IZO), or diamond-like carbon (DLC). The metal material comprises Al, Cr, Cu, Sn, Au, Ni, Ti, Pt, Pb, Zn, Cd, Sb, Co or the alloys thereof. Referring to FIG. 2A, the first electrode 271 is substantially on the central area of the second conductive type semiconductor layer 254. The extension electrode 272 comprises a first extension 2721 and a second extension 2722. The first extension 2721 extends from the first electrode 271 toward the edge of the light-emitting device 1. The two ends of the second extension 2722 extend respectively in an extension direction from the two respective sides of the first extension 2721 away from the first extension 2721, wherein the extension direction is substantially parallel to the edge of the light-emitting device 1. Referring to FIG. 2B, the extension electrode 272 is on the electrical contact layer 26 and overlays at least one of the surfaces of the electrical contact layer 26.

The electrical contact layer 26 is between the extension electrode 272 and the light-emitting stack 25 so as to form an ohmic contact between the extension electrode 272 and the light-emitting stack 25. The conductivity type of the electrical contact layer 26 is the same as that of the second conductive type semiconductor layer 254. The material of the electrical contact layer 26 comprises semiconductor material comprising one or more elements selected from the group consisting of Ga, Al, In, As, P, N, and Si.

The transparent insulating layer 28 is between the first electrode 271 and the light-emitting stack 25. In the present embodiment, a part of the transparent insulating layer 28 overlays a part of the electrical contact layer 26 to reduce the possibility of forming a dent on a surface of the first electrode 271 distal from the substrate 20, wherein the dent is caused by a height difference at the joint between the transparent insulating layer 28 and the electrical contact layer 26 when the transparent insulating layer 28 does not overlay a part of the electrical contact layer 26. As a result, in the present embodiment, the surface of the first electrode 271 distal from the substrate 20 is more planar. The transparent insulating layer 28 has a refractive index between 1 and 3.4 both inclusive, and preferably, between 1.6 and 3.4 both inclusive, and more preferably, between 2 and 3.4 both inclusive. The transparent insulating layer 28 has a transmittance greater than 80% at the wavelength of the light emitted from the light-emitting stack 25. Preferably, the transmittance is greater than 90%. More preferably, the transmittance is greater than 95%. In the present embodiment, the transmittance is greater than 98%. Referring to FIG. 2A, the transparent insulating layer 28 comprises an edge 281 away from the center C of the second conductive type semiconductor layer 254. The first electrode 271 comprises an edge 2711 away from the center C of the second conductive type semiconductor layer 254. A part of the edge 281 of the transparent insulating layer 28 protrudes relatively to a part of the edge 2711 of the first electrode 271. Besides, the surface area of the surface of the first electrode 271 distal from the transparent insulating layer 28 is smaller than the surface area of the surface of the transparent insulating layer 28 distal from the light-emitting stack 25. As a result, the light-emitting device 1 has better luminous efficacy and has higher brightness along Y axis. Preferably, the surface area of the surface of the transparent insulating layer 28 is between 5% and 97% both inclusive of the surface area of the active layer 253. In the present embodiment, the surface area of the surface of the transparent insulating layer 28 is 7.7% of the surface area of the active layer 253. The material of the transparent insulating layer 28 comprises oxide material comprising indium tin oxide (ITO), indium oxide (InO), tin oxide (SnO), cadmium tin oxide (CTO), antimony tin oxide (ATO), aluminum zinc oxide (AZO), zinc tin oxide (ZTO), gallium doped zinc oxide (GZO), tungsten doped indium oxide (IWO), zinc oxide (ZnO), indium-doped cadmium oxide (ICO), indium titanium oxide (ITiO), indium zinc oxide (IZO), indium gallium oxide (IGO), gallium and aluminum co-doped zinc oxide (GAZO) or the combinations thereof. In the present embodiment, the transparent insulating layer 28 is composed of aluminum zinc oxide (AZO). Besides, oxygen is injected during the process of forming the transparent insulating layer 28 on the light-emitting stack 25. The sheet resistance and the transmittance of the transparent insulating layer 28 composed of AZO are changed by adjusting the amount of the injected oxygen during the process of forming the transparent insulating layer 28, so that the transparent insulating layer 28 has a transmittance greater than 80% and has lower electrical conductivity. Preferably, with a thickness not less than 800 angstrom (Å), the transparent insulating layer 28 has a sheet resistance greater than $10\Omega/\square$ (Ohm/Sq), and more preferably, greater than $10^3\Omega/\square$. In the present embodiment, the transparent insulating layer 28 has a sheet resistance greater than $10^6\Omega/\square$. The thickness of the transparent insulating layer 28 is, for example, not less than 800 Å. In the present embodiment, the thickness of the transparent insulating layer 28 is about 0.5 μm.

The material of the light-emitting stack 25 comprises semiconductor material comprising one or more elements selected from the group consisting of Ga, Al, In, As, P, N, and Si. The material can be AlGaInP series, Group III nitride material system such as AlGaInN series, or can be ZnO series. The first conductive type semiconductor layer 252 and the second conductive type semiconductor layer 254 as mentioned above are different in electricity, polarity or dopant, and are semiconductor materials used for providing electrons or holes respectively, wherein the semiconductor materials can be a single layer of a semiconductor material or multiple layers of a semiconductor material or semiconductor materials. As used herein, "multiple" is generally defined as two or more than two. The polarity can be chosen from any two of the group consisting of p-type, n-type and i-type. The active layer 253, where the electrical energy and the light energy can be converted or stimulatively converted, is disposed between the first conductive type semiconductor layer 252 and the second conductive type semiconductor layer 254, which are different in electricity, polarity or dopant, or are semiconductor materials used for providing electrons or holes respectively as mentioned above. The structure of the active layer 253 can be single heterostructure (SH), double heterostructure (DH), double-side double heterostructure (DDH) or multi-quantum well (MQW) structure, wherein the wavelength of the light emitted from the active layer can be changed by adjusting the number of MQW pairs.

The window layer 251 is transparent to the light emitted from the active layer 253. The material of the window layer 251 may comprise transparent conductive material comprising indium tin oxide (ITO), indium oxide (MO), tin oxide (SnO), cadmium tin oxide (CTO), antimony tin oxide (ATO), aluminum zinc oxide (AZO), zinc tin oxide (ZTO), gallium doped zinc oxide (GZO), tungsten doped indium oxide (IWO), zinc oxide (ZnO), MgO, AlGaAs, GaN, GaP or indium zinc oxide (IZO).

The transparent conductive layer 23 is transparent to the light emitted from the active layer 253, and is for improving the ohmic contact between the window layer 251 and the reflective layer 22 and improving the current spreading efficiency. Besides, the transparent conductive layer 23 and the reflective layer 22 function as an omni-directional reflector (ODR). The material of the transparent conductive layer 23 comprises transparent conductive material comprising indium tin oxide (ITO), indium oxide (InO), tin oxide (SnO), cadmium tin oxide (CTO), antimony tin oxide (ATO), aluminum zinc oxide (AZO), zinc tin oxide (ZTO), gallium doped zinc oxide (GZO), tungsten doped indium oxide (IWO), zinc oxide (ZnO), GaP, Indium cerium oxide (ICO), indium titanium oxide (ITiO), indium zinc oxide (IZO), indium gallium oxide (IGO), Gallium and aluminum co-doped zinc oxide (GAZO) or the combinations thereof.

The insulating layer 24 has a transmittance greater than 90% to the light emitted from the active layer 253 and has a refractivity index less than 1.4, and preferably, has a refractivity index between 1.3 and 1.4 both inclusive. The transparent conductive layer 23 overlays a surface of the insulating layer 24. The material of the insulating layer 24 comprises insulating materials that are non-oxide, such as benzocyclobutene (BCB), cyclic olefin polymers (COC), fluorocarbon polymer, silicon nitride ($SiN_x$), $CaF_2$ or $MgF_2$. The material of the insulating layer 24 comprises halide or IIA-VIIA compound, such as $CaF_2$ or $MgF_2$. In the present embodiment, the material of the insulating layer 24 is $MgF_2$. The refractivity index of the insulating layer 24 is smaller than the refractivity index of the window layer 251 and smaller than the refractivity index of the transparent conductive layer 23. As a result, the critical angle for the window layer 251/the insulating layer 24 interface is smaller than the critical angle for the window layer 251/the transparent conductive layer 23 interface. Accordingly, the interface between the window layer 251 and the insulating layer 24 increases the probability of the total internal reflection when the light emitted from the active layer 253 is incident on the insulating layer 24.

The reflective layer 22 reflects the light emitted from the active layer 253. The material of the reflective layer 22 comprises metal material comprising Cu, Al, Sn, Au, Ag, Pb, Ti, Ni, Pt, W, or the alloys thereof. The bonding layer 21 is between the substrate 20 and the reflective layer 22 for connecting the substrate 20 to the reflective layer 22 and may comprise multiple sub-layers (not shown). The material of the bonding layer 21 can be transparent conductive material or metal material. The transparent conductive material comprises indium tin oxide (ITO), indium oxide (InO), tin oxide (SnO), cadmium tin oxide (CTO), antimony tin oxide (ATO), aluminum zinc oxide (AZO), zinc tin oxide (ZTO), gallium doped zinc oxide (GZO), zinc oxide (ZnO), GaP, Indium cerium oxide (ICO), tungsten doped indium oxide (IWO), indium titanium oxide (ITiO), indium zinc oxide (IZO), indium gallium oxide (IGO), Gallium and aluminum co-doped zinc oxide (GAZO) or the combinations thereof. The metal material comprises Cu, Al, Sn, Au, Ag, Pb, Ti, Ni, Pt, W, or the alloys thereof.

The substrate 20 is for supporting the light-emitting semiconductor stack 25 and other layers or structures thereon. The material of the substrate 20 can be transparent material or conductive material. The transparent material comprises sapphire, diamond, glass, epoxy, quartz, acrylics, $Al_2O_3$, ZnO or AlN. The conductive material comprises Cu, Al, Mo, Sn, Zn, Cd, Ni, Co, diamond like carbon (DLC), graphite, carbon fiber, metal matrix composite (MMC), ceramic matrix composite (CMC), Si, phosphorus iodide (IP), ZnSe, GaAs, SiC, GaP, GaAsP, ZnSe, InP, $LiGaO_2$ or $LiAlO_2$.

Compared to a conventional light-emitting device having the same structure as the light-emitting device 1 as shown in FIGS. 2A and 2B but without having the transparent insulating layer 28, the light-emitting device 1 has higher luminous intensity than that of the conventional light-emitting device by about 6 to 7%. Accordingly, the light extraction efficiency of the light-emitting device 1 is improved. In another embodiment, compared to a light-emitting device 1 comprising a 0.5-μm-thick transparent insulating layer 28, the light-emitting device 1 comprising a 1-μm-thick transparent insulating layer 28 has higher luminous intensity. In another embodiment, compared to a light-emitting device 1 comprising a 1-μm-thick transparent insulating layer 28, the light-emitting device 1 comprising a 2-μm-thick transparent insulating layer 28 has higher luminous intensity than that of the light-emitting device comprising the 1-μm-thick transparent insulating layer 28 by about 5%. Accordingly, the light-emitting device 1 comprising a 2-μm-thick transparent insulating layer 28 has higher light extraction efficiency.

Figure 3:
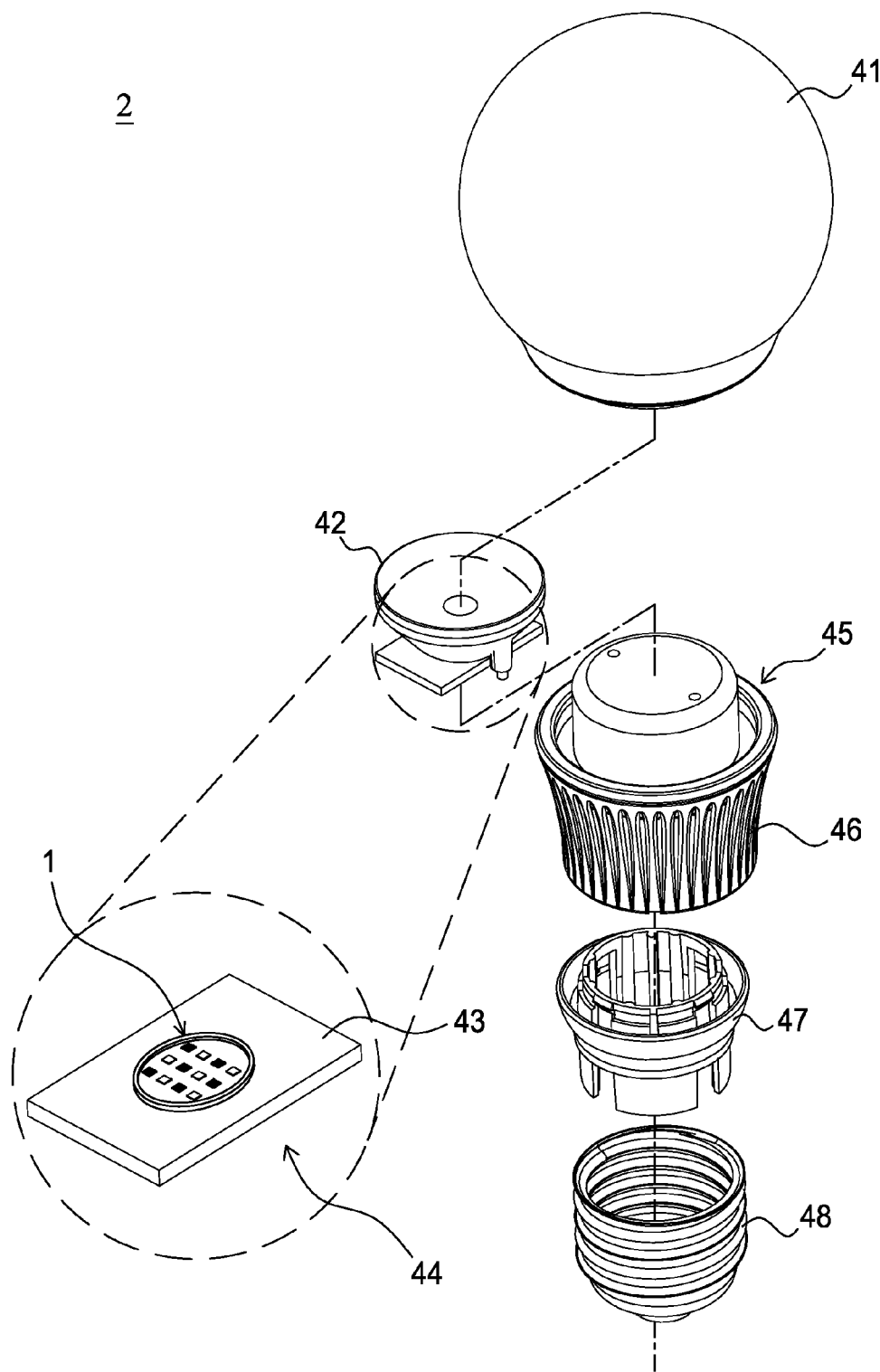
FIG. 3 shows an exploded view of a light bulb in accordance with the second embodiment of the present application.

FIG. 3 is an exploded view of a light bulb 2 in accordance with one of the embodiments of the present application. The light bulb 2 comprises a lamp 41, a lens 42 disposed in the lamp 41, a lighting module 44 disposed under the lens 42, a lamp holder 45 comprising a heat sink 46, wherein the lighting module 44 is used for holding the lighting module 44, a connecting part 47, and an electrical connector 48, wherein the connecting part 47 connects the lamp holder 45 to the electrical connector 48. The lighting module 44 comprises a carrier 43 and multiple light-emitting devices 1 of any one of the embodiments as mentioned above, wherein the multiple light-emitting devices 1 are on the carrier 43.

The foregoing description of preferred and other embodiments in the present disclosure is not intended to limit or restrict the scope or applicability of the inventive concepts conceived by the Applicant. In exchange for disclosing the inventive concepts contained herein, the Applicant desires all patent rights afforded by the appended claims. Therefore, it is intended that the appended claims include all modifications and alterations to the full extent that they come within the scope of the following claims or the equivalents thereof.

What is claimed is:

1. A light-emitting device, comprising:
   a light-emitting stack having an active layer;
   a transparent insulating layer on the light-emitting stack;
   an insulating layer under the light-emitting stack; and
   an electrode structure having a first electrode on the transparent insulating layer;
   wherein a surface area of a surface of the first electrode distal from the transparent insulating layer is smaller than a surface area of a surface of the transparent insulating layer distal from the light-emitting stack, the refractive index of the transparent insulating layer is between 1 and 3.4 both inclusive, and the transmittance of the transparent insulating layer is greater than 80%.

2. The light-emitting device according to claim 1, wherein the transparent insulating layer comprises an edge and the first electrode comprises an edge, and a part of the edge of the transparent insulating layer protrudes relatively to the edge of the first electrode.

3. The light-emitting device according to claim 1, wherein the transparent insulating layer has a thickness not less than 800 angstrom (Å).

4. The light-emitting device according to claim 1, wherein the transparent insulating layer comprises oxide material.

5. The light-emitting device according to claim 4, wherein the oxide material comprises aluminum zinc oxide.

6. The light-emitting device according to claim 1, further comprising an electrical contact layer on the light-emitting stack and in contact with the transparent insulating layer.

7. The light-emitting device according to claim 1, wherein the electrode structure further comprises an electrode and an extension electrode overlaying and in direct contact with a part of the electrical contact layer, and the transparent insulating layer separates the electrode from another part of the electrical contact layer.

8. The light-emitting device according to claim 1, wherein a bottom surface of the transparent insulating layer and a bottom surface of the electrical contact layer are substantially coplanar on the light-emitting stack.

9. The light-emitting device according to claim 1, further comprising a substrate under the insulating layer.

10. The light-emitting device according to claim 9, further comprising a reflective layer between the substrate and the insulating layer.

11. The light-emitting device according to claim 1, wherein the insulating layer has a refractive index less than 1.4.

12. The light-emitting device according to claim 1, wherein the light-emitting stack comprises a window layer between the insulating layer and the active layer, wherein the window layer has a refractive index greater than that of the insulating layer.

13. The light-emitting device according to claim 1, further comprising a transparent conductive layer overlaying a surface of the insulating layer.

14. The light-emitting device according to claim 1, wherein the insulating layer comprises halide.

15. The light-emitting device according to claim 1, wherein the insulating layer comprises IIA-VIIA compound.

16. A light-emitting device, comprising:
a light-emitting stack having an active layer;
a transparent insulating layer on the light-emitting stack; and
an electrode structure having a first electrode on the transparent insulating layer; wherein a surface area of a surface of the first electrode distal from the transparent insulating layer is smaller than a surface area of a surface of the transparent insulating layer distal from the light-emitting stack, the refractive index of the transparent insulating layer is between 1 and 3.4 both inclusive, the transmittance of the transparent insulating layer is greater than 80%, and the transparent insulating layer comprises oxide material.

17. The light-emitting device according to claim 16, wherein the oxide material comprises aluminum zinc oxide.

18. The light-emitting device according to claim 16, further comprises an electrical contact layer on the light-emitting stack and in contact with the transparent insulating layer.

19. The light-emitting device according to claim 18, wherein the electrode structure further comprises an electrode and an extension electrode overlaying and in direct contact with a part of the electrical contact layer, and the transparent insulating layer separates the electrode from another part of the electrical contact layer.

20. The light-emitting device according to claim 18, wherein a bottom surface of the transparent insulating layer and a bottom surface of the electrical contact layer are substantially coplanar on the light-emitting stack.

* * * * *